(12) United States Patent
Nielsen

(10) Patent No.: US 9,122,274 B2
(45) Date of Patent: Sep. 1, 2015

(54) TEST SYSTEM FOR DETERMINING A FREQUENCY RESPONSE OF A VIRTUAL POWER PLANT

(71) Applicant: Kaj Skov Nielsen, Issaquah, NY (US)

(72) Inventor: Kaj Skov Nielsen, Issaquah, NY (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 514 days.

(21) Appl. No.: 13/648,364

(22) Filed: Oct. 10, 2012

(65) Prior Publication Data

US 2014/0100810 A1  Apr. 10, 2014

(51) Int. Cl.
*G06F 19/00* (2011.01)
*G05B 23/02* (2006.01)
*G01R 31/42* (2006.01)
*G01R 19/25* (2006.01)

(52) U.S. Cl.
CPC ........ *G05B 23/0256* (2013.01); *G01R 19/2513* (2013.01); *G01R 31/42* (2013.01)

(58) Field of Classification Search
CPC .................................................. G05B 23/0256
USPC ...................... 702/109, 64–66, 182–185, 188
See application file for complete search history.

(56) References Cited

U.S. PATENT DOCUMENTS

2012/0253479 A1* 10/2012 Radl ............................... 700/12

* cited by examiner

*Primary Examiner* — Edward Raymond

(57) ABSTRACT

Disclosed is a test system for determining a frequency response of a virtual power plant connected to a utility grid and including a plurality of distinct power plants. The test system includes a test sequence module for providing a frequency test sequence. The frequency test sequence includes a set of frequency test values; and an injection unit for injecting values of the frequency test sequence simultaneously to nodes of the virtual power plant. A node of the virtual power plant includes any of: a power production unit of a power plant, a power storage unit of a power plant, a plant controller of a power plant. Further described are a virtual power plant and a method of testing a frequency response of a virtual power plant.

15 Claims, 2 Drawing Sheets

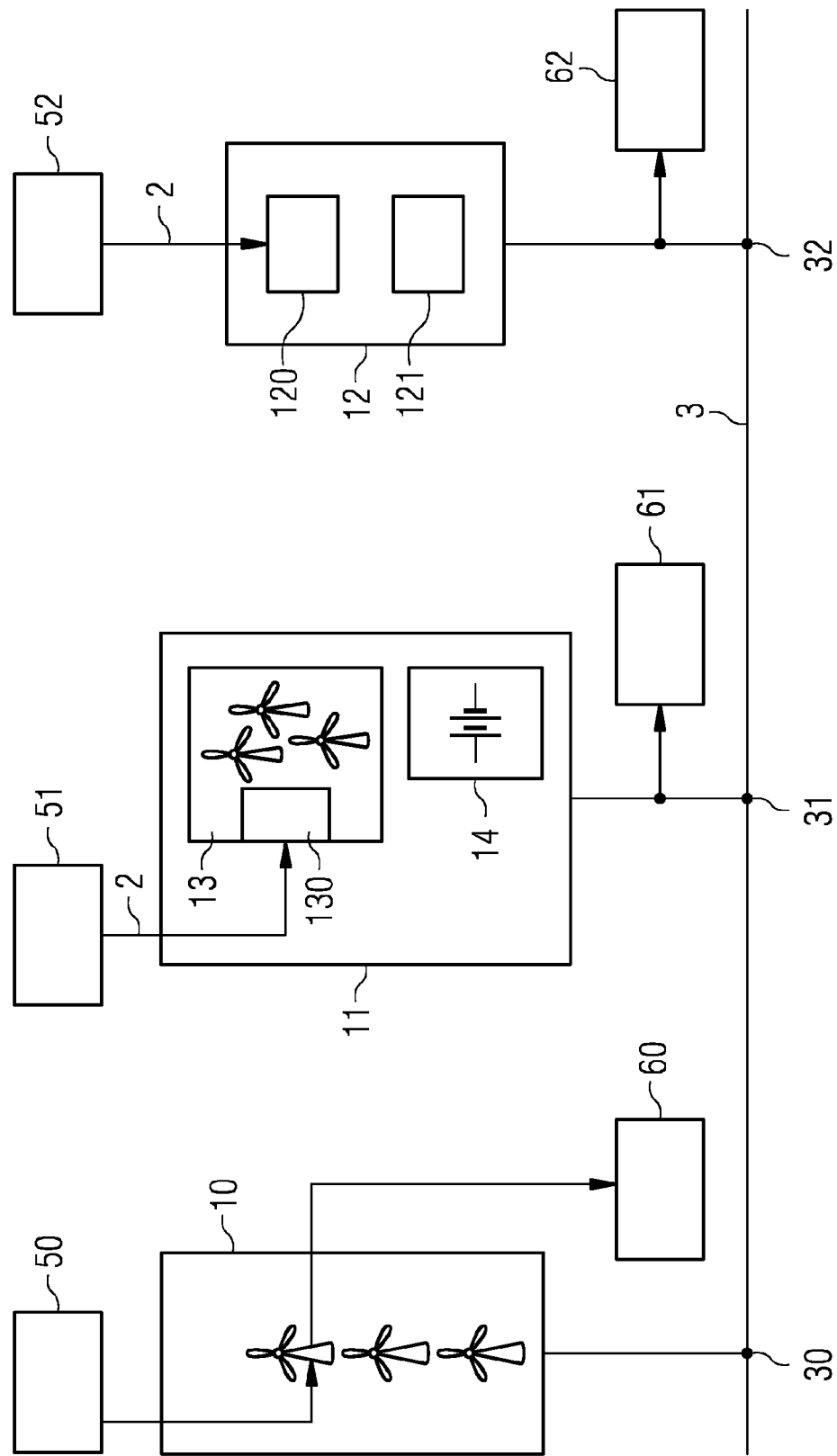

TEST SYSTEM FOR DETERMINING A FREQUENCY RESPONSE OF A VIRTUAL POWER PLANT

FIELD OF INVENTION

A test system for determining a frequency response of a virtual power plant, a virtual power plant, and a method of testing a frequency response of a virtual power plant are disclosed.

BACKGROUND OF INVENTION

Changes in the supply or demand of active power from a power grid can result in an increase or decrease of the grid frequency. For example, an increase in demand will result in a drop in the grid frequency. An allowable range within which the grid frequency can depart from the nominal grid frequency or "dead band" is specified in national or local grid requirements that are imposed on power producers feeding into the grid. The power producers must ensure that their power plants can respond to a frequency event, i.e. a situation in which the grid frequency moves outside or indicates a tendency to move outside the predefined dead band, by initiating a frequency response in order to contribute to moving the grid frequency back within the permitted bounds. Since a power plant's frequency response is usually a requirement of the relevant grid code, it can also be referred to as the "grid code frequency response". Here and in the following, the terms "grid code frequency response" and "frequency response" is to be understood as a measure of the ability of a power plant to respond to a change in the frequency of the grid into which it feeds.

Therefore, a grid operator or an operator of a power production facility can wish to perform a frequency response test to demonstrate compliance with the local grid interconnection requirements for frequency response or inertial response. The frequency response of a power plant (also referred to as a "power facility") will describe its ability to respond to a change in grid frequency, for example its ability to release additional power into the grid if the frequency has dropped. In the known approaches, to carry out a frequency response test, a power plant is operated in a "test" mode, during which an actual grid frequency is replaced by a test sequence comprising simulated digital frequency samples or an analogue simulated frequency signal. The power plant then operates using these grid frequency values, and the output of the power plant should reflect its behavior in a real world situation. Usually, a "test switch" is used to place the facility in the "test mode", and once the test is completed, the test switch places the facility back into the normal mode of operation once more. For a power plant such as a gas turbine power station, the plant controller directly controls the generator, and the frequency response is essentially provided by that generator. For installations involving multiple plant controllers, for example in the case of a large wind farm, the plant controllers must be tested simultaneously. To this end, parallel injection tools with identical injection profiles or time sequences must be set up for the separate plant controllers. The test sequences are injected simultaneously to the plant controllers, and triggered to start at the same time, in order to obtain a realistic assessment of the collective frequency response.

Newer types of power networks can comprise power generation facilities as well as power storage facilities. The facilities can be distributed over several locations, for example a number of geographically separate offshore wind parks and a number of power storage plants located onshore for storing "surplus" energy. These facilities can feed separately into the same utility grid at separate points of connection, or a power plant facility might comprise one or more power production units as well as power storage units, so that such a "distributed" power network can be regarded as a "virtual power plant", with a virtual grid interconnection point representing the separate connection points of the individual power plants, and a virtual combined grid output representing the net power output of the different facilities.

The currently available test systems cannot be applied to such power networks. Existing solutions involve the injection of a test sequence into a single plant controller, or, in the case of a power plant such as a wind farm, into the controller of a single sub-unit such as a wind turbine. The current tools therefore cannot be used in a situation requiring frequency response at a power generation unit level as well as frequency response from a power plant controller, since the frequency response for the sub-unit must be extrapolated to estimate the overall frequency response of the entire power plant, which can therefore differ significantly from its actual frequency response. Furthermore, testing a power storage unit and a power production unit separately to obtain their frequency responses does not give any indication of the combined frequency response of the power storage unit together with the power production unit. Another disadvantage of the known test systems is that they require considerable effort in setting up if they are to be used to determine the frequency response of more than one plant controller. This means that existing test systems cannot simulate or predict the collective or aggregate response at the point of common connection for the type of virtual power plant described above.

SUMMARY OF INVENTION

A straightforward and reliable way of testing or demonstrating the frequency response of a virtual power plant of the type described above is described herein.

A test system for determining a frequency response of a virtual power plant, connected to a utility grid and comprising a plurality of distinct power plants, comprises a test sequence module for providing a frequency test sequence, which frequency test sequence comprises a set of frequency test values; and an injection unit for injecting values of the frequency test sequence simultaneously to nodes of the virtual power plant; wherein a node of the virtual power plant comprises any of: a power production unit of a power plant, a power storage unit of a power plant, a plant controller of a power plant.

Unlike the known solutions, which cannot be used to test the frequency response of a power network in which the frequency response involves a response at the level of an individual power production unit (such as a wind turbine) as well as frequency response at the plant controller level, the disclosed test system may inject a selected frequency test sequence simultaneously to any node that has a frequency response function, i.e. that is capable of contributing to a correction of a frequency error.

The accumulated responses of a plurality of plants may act together to ensure that the grid frequency returns to a satisfactory value such as a nominal frequency within the "dead band".

A virtual power plant, for connection to a utility grid and comprising a plurality of separate power plants, may comprise such a test system for determining a frequency response of the virtual power plant. The test system allows a grid operator to determine or validate the accumulated response of the virtual network to a frequency event, i.e. the overall combined response of a virtual entity comprising all the power generation facilities and all the power storage facilities of the virtual power network. Knowledge of the frequency response of the virtual power plant assists the plant owner/operator in demonstrating to the grid operator that the virtual plant complies with the frequency response requirements.

A method of testing a frequency response of a virtual power plant, connected to a utility grid and comprising a plurality of distinct power plants, comprises obtaining a frequency test sequence for that virtual power plant, which frequency test sequence comprises a set of frequency test values, and simultaneously injecting values of the frequency test sequence into nodes of the virtual power plant; wherein a node of the virtual power plant comprises any of: a power production unit of a power plant, a power storage unit of a power plant, a plant controller of a power plant. A grid operator may obtain a reliable estimation of the time taken for the virtual power plant to respond with the required amount of change in active power level corresponding to the injected frequency signals.

Features of different claim categories may be combined as appropriate to give further embodiments not described herein.

A "power production plant" or "power generation plant" is to be understood in the following to comprise one or more plant controllers controlling any number of power generation facilities or "production units", for example wind turbines of a wind park, solar panels of a photovoltaic arrangement, etc., capable of generating electricity for feeding into a utility grid. Other examples of a power production plant might be a tidal power plant, a hydro power plant, a biomass power plant, a gas power plant, a wave power plant, etc. Similarly, a power storage plant may comprise any number of power storage facilities, and may also comprise one or more plant controllers. In the following, the terms "plant" and "facility" may be used interchangeably. A "power plant" may comprise any number of power production plants and/or any number of power storage plants. For example, a power plant could comprise a wind farm as well as a number of storage facilities, and may be controlled by one or more plant controllers. The virtual power network may comprise any number of power plants. The terms "frequency response" and "inertial response" may be used interchangeably in the following.

In an embodiment, any controllers of the power plants of the virtual power plant are connected over a shared network, using any appropriate communication standard such as, for example, internet protocol (IP), so that any data such as frequency test sequences may be distributed or shared in a straightforward manner.

The frequency response of a power plant to a frequency event on the grid involves a change in the active power output of the power plant. In the case of a virtual power plant, the active power delivery is an aggregate of the active power produced by any power production facilities and the active power transferred to or from any power storage facility.

Generally, frequency response for a power plant will comprise multiple control loops. For example, the power facility generally comprises a central frequency response function at a grid measurement point, typically at the substation of the power facility. Another frequency response function may be implemented in a power production unit such as a wind turbine, where the frequency response is carried out at turbine controller level. For a power storage facility, a frequency response control loop may be implemented at the level of a power storage unit controller. It is also possible, for example, to implement an additional control loop in power production subsystems even if such systems do not directly control power production but only control internal power demand.

A subsystem implementing a frequency response function could include any of the turbine controller, the yaw controller, the hydraulic controller, the frequency converter, or the UPS system of a wind turbine, for example. In the event of a drop in frequency, i.e. an under-frequency event, such an additional control loop may contribute to the aggregate virtual plant-level frequency response as "seen" by the power grid.

In the event of a frequency error at grid level, it is important that the grid frequency is brought back to an acceptable value as soon as possible. Various nodes at various levels of a power network may contribute to a fast response. For example, a fast response to an under-frequency at the grid may involve temporary disconnection of non-essential power consumption units, combined with a centrally controlled inertial response. Examples of non-essential load or non-essential power consumption in a wind turbine might be local power consumption by a yaw motor, heating/cooling arrangement, or any other such device that consumes power. Such devices could be simply halted to provide an active frequency control, or they may temporarily be run off a local uninterruptible power supply (UPS). Of course, instead of disconnecting such a load entirely, it may suffice to simply reduce the quantity of power it consumes in order to contribute to active frequency control, at least until the frequency event has been corrected. Therefore, in the test system, the injection unit may be realized to inject the frequency test sequence to a node that comprises such an active frequency control function.

The test sequence module may be realized to provide a set of test frequency values to replace actual grid frequency values for a predetermined duration. In an embodiment, one or more frequency test values is injected in "real time" to the nodes of the virtual power plant, i.e. the injected frequency value immediately replaces the momentary actual grid frequency value.

In an another embodiment, a set of test values may be compiled and distributed in advance to any relevant nodes of the virtual plant. In this case, the set of test frequency values may comprise a list of time stamps, wherein each time stamp is linked to a specific (simulated) grid frequency value. Such a frequency test sequence might extend over 10 minute, 300 seconds, or any appropriate length of time. The time stamp of each value may indicate the time at which the frequency value is to be injected into the node.

Then, the method may comprise a step of issuing a trigger signal to trigger the injection of the frequency test sequence into the nodes of the virtual power plant. An example could be that from 0 s to 60 s all nodes will receive a "grid frequency value" of 50.00 Hz, from 60 s to 120 s all nodes receive a value of 50.20 Hz, and from 120 s to 180 all nodes receive a value of 50.00 Hz. Therefore, the test may determine how the virtual plant will respond to a real-life situation in which the grid frequency exceeds a nominal value of 50 Hz for a duration of 60 seconds.

Whether the frequency values are injected in a real-time manner or in a delayed or deferred manner, the frequency test itself may be carried out essentially simultaneously on all relevant nodes of the virtual power plant, to obtain a reliable and informative frequency response which may be used by the grid operator as a basis on which to evaluate the virtual power plant's performance.

Of course, in real life, the ability of a renewable power plant to respond to a frequency event may depend on the momentary environmental situation. Therefore, in a further embodiment, a frequency test may be carried out on the basis of a specific environment scenario. For example, for the plant controller of a wind park, a certain environment scenario might consider a certain average wind speed, gust speed etc.

For a plant controller of a photovoltaic unit, an environment scenario might consider cloud cover, date and time of day. In an embodiment, the method also comprises the step of monitoring appropriate environmental conditions before triggering the execution of a specific frequency test sequence. The frequency test sequence in conjunction with such environmental values may be regarded as a specific "scenario", since the same frequency test sequence would result in different response times, for example in the case of a wind park running the test sequence with a high wind speed scenario and again with a low wind speed scenario. The method may comprise a step of compiling a plurality of scenarios comprising logged environmental data and time series for such values together with the aggregate frequency response as measured at the grid measurement point(s).

A response to a frequency event may be provided at a number of "levels" in a virtual power plant. For example, in the case of a virtual plant comprising a wind park, individual wind turbines may contribute to frequency response directly. Therefore, in an embodiment, the injection unit is realized to inject the frequency test sequence directly to the power production units and/or the power storage units and/or any individual plant subsystem of the virtual power plant.

In an embodiment, the injection unit may be realized to inject the frequency test sequence to the plant controllers of a power plant. For example, a wind park plant controller will then handle the distribution of the frequency test sequence to all of its wind turbines. This has some benefits in that the configuration of the injection tool may be simplified, since the plant controller already avails of relevant information such as which turbines should receive the frequency test sequence. In this embodiment, the injection tool need not be adapted to manage this information also. Since each individual turbine may make an individual contribution to the collective response to a frequency event, but cannot locally determine the accumulated impact, a central frequency response function at a power plant level allows a very accurate response, since the power plants may respond to the continually changing conditions such as availability of turbines, wind speed, etc.

As already indicated, the injection unit is realized to distribute a frequency test sequence to power storage facilities as well as to power production facilities. In an embodiment, the injected signal may be distributed to one or more power generation units of a power generation plant and/or to one or more power storage units of a power storage plant. This embodiment makes it possible to distribute the injected signal not just to the plant controller level but all the way to the individual turbines of the wind park. For example, the injection tool may be configured to transmit a previously compiled series of test frequency values to multiple TCP/IP (transmission control protocol/internet protocol) addresses on pre-configured ports and tags of the various power plants, according to the selected test sequence. A frequency value delivered in this way by the injection or "test" tool shall, at each node, override the actual locally measured grid frequency. Each node will then internally regulate its active power according to the received frequency values as they are updated. The local node may respond with any combination of demand response, power boost, inertial response, power reduction, increased local consumption, storage, UPS operation or load shifting. A local frequency regulator at each node shall revert to the actual locally measured grid frequency value when the transmitted set or string of frequency values is exhausted, i.e. when the test sequence is complete.

Of course, any suitable identifier other than TCP/IP addresses may be used to identify separate nodes or target serial tags.

The effect of a frequency test sequence may depend on the level of the overall system at which it is injected. For example, injecting a frequency test sequence into a wind farm plant controller may result in its adjusting of the active power setpoints that it transmits to its individual wind turbines. Injecting a frequency test sequence directly into the local controller of a wind turbine may result in disconnection of internal loads or local adjustment to the active power settings, as already indicated. Injection of a frequency test sequence into the controller of a power storage unit may result in an adjustment of the active energy flow into or out of that power storage unit.

In an embodiment, a virtual power plant may comprise at least one power production plant and at least one power storage plant. These may be connected at separate connection points to a shared utility grid. Equally, one of its power plants, connected to a utility grid, may itself comprise two or more power facilities controlled by a single plant controller, for example a power plant might comprise a wind farm that also comprises a battery storage facility for storing surplus energy generated by the wind turbines. In such embodiments of the virtual power plant, the frequency test sequence may be distributed to all power production plants and to all power storage plants of the virtual power plant.

A specific type of plant controller may be implemented as several instances in one or more power plants of the virtual power plant. For example, one type of plant controller may be used several times in different wind parks. However, the number of turbines associated with each instance of that wind park controller may be different, depending on the selected electrical plant topology for the relevant wind park. Therefore, in a further embodiment, the plant controller of a wind farm may be realized to inject a frequency test sequence to all wind turbines associated with that plant controller. In this way, an indirect injection of the frequency test sequence via the wind park controller will automatically accommodate all the possible topologies without requiring detailed configuration at the test system level, allowing a faster, simpler and more profitable setup of a test sequence. For example, for the topology of a first wind park, the wind park controller instance may control turbines 1-25, and in the topology of a second wind park, the identical wind park controller instance may control turbines 1-50. The test system does not need to know this, and the injection unit may simply issue the frequency test sequence, allowing the park controllers to take care of the distribution to local production unit level, i.e. to turbine controller level.

BRIEF DESCRIPTION OF THE DRAWINGS

Other objects and features of the present disclosure will become apparent from the following detailed descriptions considered in conjunction with the accompanying drawings. It is to be understood, however, that the drawings are designed solely for the purposes of illustration and not as a definition of the limits of the invention.

FIG. 2 shows a prior art test system for a power network.

DETAILED DESCRIPTION OF INVENTION

Figure 1:
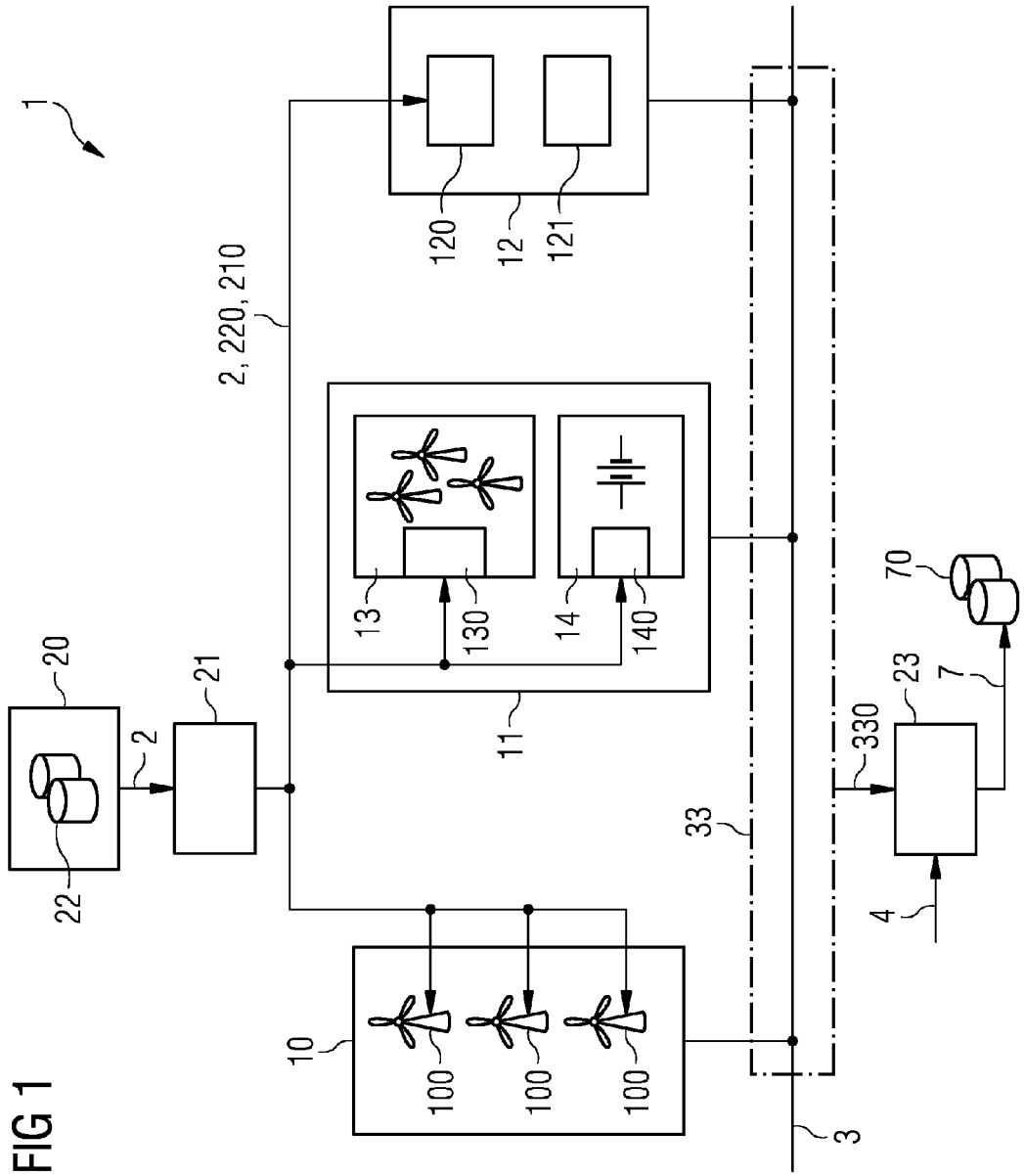
FIG. 1 shows a virtual power plant according to a first embodiment.

In the diagrams, like numbers refer to like objects throughout.

FIG. 1 shows a virtual power plant 1 according to a first embodiment. The virtual power plant 1 includes various facilities 10, 11, 12 connected to a virtual grid 3 at a virtual point of common connection 33. The facilities in this exemplary embodiment are a wind park 10, comprising a plurality of wind turbines 100; a combined power plant 11 comprising a wind park 13 and a storage facility 14; and another power plant 12 with a plant controller 120 for controlling a power generation facility 121.

These power facilities 10, 11, 12 may be located at geographical locations that are remote from each other, yet they are each connected to the same utility grid 3. To test the response of the virtual power plant 1 to a frequency event, a test system comprising a test sequence module 20 and an injection unit 21 is used to compile a frequency test sequence 2 and to issue the frequency test sequence 2 to the appropriate nodes of the virtual power plant 1, i.e. the nodes that are capable of contributing an active frequency response, for example by sending a test frequency value 220 to specific TCP/IP addresses. In this case, frequency values 220 of the test sequence 2 are distributed to the wind turbine controllers of the wind turbines 100 of the wind farm 10; to a controller 130 of the wind park 13 of the power facility 11; to a controller 140 of the storage facility 14 of the power facility 11; and to the plant controller 120 of the power facility 12. The plant controller 130 of the wind park 13 may distribute frequency values 220 of the test sequence 2 to any turbines associated with it.

The injection unit 21 distributes frequency test values 220 to the nodes 100, 120, 130, 140 according to the selected test sequence 2, overriding the local frequency measurements. The nodes 100, 120, 130, 140 then respond by carrying out appropriate regulation functions to adjust the amount of active power produced (in the case of the power facilities 10, 13, 12) or the amount of active power consumed (in the case of the power storage facility 14), as new frequency values are received during the test sequence, so that a reliable picture may be obtained about the ability of the virtual power plant 1 to respond to such a frequency event. In a particularly straightforward realization, the injection unit 21 distributes the frequency test values 220 for real-time injection into the nodes 100, 120, 130, 140 of the virtual plant 1.

The injection unit 21 may alternatively distribute an entire test sequence 2 in advance, wherein a test value 220 in this case comprises time-stamp/frequency pairs, and may issue or broadcast a separate trigger signal 210 at a later point in time to trigger the frequency response test. This is another way of ensuring that the frequency test sequence 2 runs simultaneously on those nodes 100, 120, 130, 140. The nodes 100, 120, 130, 140 then respond by carrying out appropriate regulation functions to adjust the amount of active power produced (in the case of the power facilities 10, 13, 12) or the amount of active power consumed (in the case of the power storage facility 14), so that a reliable picture may be obtained about the ability of the virtual power plant 1 to respond to such a frequency event. The response may be evaluated based on logged time-stamped data collected by the data analysis unit 23, which has been realized to collect grid measurements from each of the grid connections for each of the plants 10, 11, 12. For a virtual plant 1 there cannot be an actual measurement point for the combined output, instead a combined frequency response output 330 may be a sum or aggregate output of the outputs from individual power plants of the virtual power plant.

A frequency test sequence 2 or injection pattern 2 may comprise a set of regional or national profiles, for example an injection pattern required for grid compliance in a given region or country. Information about local frequency test requirements is resolved with the plant owners and the set of test sequences are loaded onto the database 22 in advance. An injection pattern 2 may be a list of values, to replace actual grid frequency values at each of the nodes comprising a frequency response function, for example just frequency values for real-time injection, or time-stamp/frequency pairs for injection at a later point in time. A simple example of such a list 2 of time-stamp/frequency pairs might be:

| | |
|---|---|
| 0 sec | 50.00 Hz |
| 60 sec | 50.20 Hz |
| 120 sec | 50.00 Hz |
| 180 sec | 50.00 Hz |

The nodes will interpret the above sequence to mean that a specified frequency is to persist until a new value is received, or until the test sequence ends.

Of course, a frequency test sequence 2 may comprise a much longer list of times and frequencies. The update interval for the injection tag may vary from a fraction of a second to tens of seconds, and the sequence 2 may represent a single frequency step or change, a series of frequency steps, a gradual frequency ramp or any other complex frequency pattern that may be described using such a list. The trigger signal 210 may simply be a time-stamp at which the nodes should switch over from using real grid frequency data to using the simulation values in the test sequence 2. For the sake of simplicity, the diagram does not show the "real" grid information input to the virtual power plant 1 or to the individual nodes in the power plants 100, 130, 140, 120.

The injection unit 21 may be configured to distribute the frequency test sequence 2 to all relevant nodes. For example, in this embodiment the injection unit 21 may be provided with a list of IP (internet protocol) addresses of the facilities that should receive the frequency test sequence 2. The injection unit 21 may also be configured with additional input, for example information concerning which injection profile to select from the database 22, an appropriate update rate, a specific time to initiate signal distribution or a trigger at which the injection should start, how many times the test sequence should run if it is to be repeated, etc.

The analysis module 23 may be used to log environment data sets 4 so that evaluation of the frequency response data 330 may include evaluation of relevant environmental data such as wind speed or available power, turbulence or any other relevant value for the performance of the wind turbines 100, wind power plant 13, power storage facility 14, or power production unit 121. Such environment data 4 may be provided by an external source, not shown here, for example by a grid operator. To this end, the frequency response data set 330 is logged together with the environment data set 4 collectively as an "environment scenario" 7 in a suitable storage facility 70 for later retrieval.

FIG. 2 shows a test system for a prior art power network comprising independently controlled power facilities 10, 11, 12 that feed into a utility grid 3. Again, these power facilities may be geographically remote from each other. Each power facility 10, 11, 12 may be run or managed by a different operator, and feeds into the grid 3 at a distinct point of connection 30, 31, 32. Since each power facility 10, 11, 12 is separately controlled, for example by independent plant operators/owners, and because the known test methods are limited in their capabilities as already described above, separate frequency responses may only be determined for the power production plants 10, 13, 12. Furthermore, since the known test methods cannot feed into many nodes simultaneously, the test sequence 2 to the wind farm 10 is injected directly into only one turbine, and the results from that single turbine must be extrapolated to represent the entire wind power plant 10. Also, since the known methods cannot be applied to the storage facility 14 of the power plant of the wind power plant 13, the frequency response of facility 11 will not take into consideration any contribution of the power storage facility 14 in combination with the wind power plant 13.

To estimate the frequency response using the prior art method, test modules 50, 51, 52 may be connected to an appropriate node, so that a test sequence may be input to that node. The response of each node is measured separately in appropriate analysis units 60, 61, 62. In the case of the logging unit 60 for the wind park 10, the output of only a single turbine is recorded, and this must be extrapolated to estimate a response for the entire plant. Such an extrapolated estimation is clearly limited by the usual margins of error and, in the case of a wind park or similar power production plant, cannot demonstrate the impact of different and varying wind speed at all the different turbines during the test duration.

Because of its limitations, the prior art test setup cannot obtain a reliable picture of the overall frequency response of all the power facilities 10, 13, 14, 12.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the term "comprising" does not exclude other elements or steps and the use of articles "a" or "an" does not exclude a plurality. The mention of a "unit" or a "module" does not preclude the use of more than one unit or module.

The invention claimed is:

1. A test system for determining a frequency response of a virtual power plant connected to a utility grid and comprising a plurality of distinct power plants, the test system comprising:
   a test sequence module that provides a frequency test sequence, the frequency test sequence comprising a set of frequency test values; and
   an injection unit that injects values of the frequency test sequence simultaneously to nodes of the virtual power plant;
   wherein a node of the virtual power plant comprises at least one power plant unit selected from the group consisting of a power production unit of a power plant, a power storage unit of a power plant, and a plant controller of a power plant.

2. The test system according to claim 1,
   wherein the test sequence module is realized to provide a set of frequency test values to replace actual grid frequency values for a predetermined duration.

3. The test system according to claim 1,
   wherein the injection unit is realized to inject a frequency test value of the frequency test sequence directly to a power production unit and/or to a power storage unit.

4. The test system according to claim 1,
   wherein the injection unit is realized to inject a frequency test value of the frequency test sequence to a plant controller of a power plant.

5. The test system according to claim 1,
   wherein the injection unit is realized to inject a frequency test value of the frequency test sequence to any node that includes an active frequency control function.

6. A virtual power plant for connection to a utility grid and comprising a plurality of distinct power plants, the virtual power plant comprising:
   a test system for determining a frequency response of the virtual power plant according to claim 1.

7. The virtual power plant according to claim 6, comprising:
   a power plant comprising a power production plant and a power storage plant.

8. The virtual power plant according to claim 6, comprising:
   a power production plant and a power storage plant arranged for connection to a shared utility grid.

9. The virtual power plant according to claim 6,
   wherein controllers of the power plants of the virtual power plant are connected over a shared network.

10. The virtual power plant according to claim 6,
    wherein a power production plant comprises a wind farm, and a power production unit of the wind farm comprises a wind turbine.

11. The virtual power plant according to claim 6,
    wherein the plant controller of a wind farm is realized to inject frequency values of the frequency test sequence to all wind turbines associated with that plant controller.

12. A method of testing a frequency response of a virtual power plant connected to a utility grid and comprising a plurality of distinct power plants, the method comprising:
    obtaining a frequency test sequence for that virtual power plant, which frequency test sequence comprises a set of frequency test values; and
    simultaneously injecting values of the frequency test sequence into nodes of the virtual power plant, wherein a node of the virtual power plant comprises any of: a power production unit of a power production plant, a power storage unit of a power storage plant, a plant controller of a power plant.

13. The method according to claim 12, comprising:
    real time injecting of a frequency test value to a node of the virtual power plant.

14. The method according to claim 12, comprising:
    first distributing the frequency test sequence to the nodes and a subsequent step of issuing a trigger signal to the nodes to trigger a simultaneous execution of the frequency test sequence at the nodes of the virtual power plant.

15. The method according to claim 12, comprising:
    recording a plurality of frequency response scenarios for the virtual power plant, wherein a frequency response scenario comprises an environment data set associated with a frequency response data set.

* * * * *